US010515602B1

(12) United States Patent
Guan (10) Patent No.: US 10,515,602 B1
(45) Date of Patent: Dec. 24, 2019

(54) GOA CIRCUIT

(71) Applicant: Wuhan China Star Optoelectronics Technology Co., Ltd., Wuhan, Hubei (CN)

(72) Inventor: Yanqing Guan, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 232 days.

(21) Appl. No.: 15/740,742

(22) PCT Filed: Nov. 29, 2017

(86) PCT No.: PCT/CN2017/113530
§ 371 (c)(1),
(2) Date: Dec. 28, 2017

(87) PCT Pub. No.: WO2019/095435
PCT Pub. Date: May 23, 2019

(30) Foreign Application Priority Data

Nov. 17, 2017 (CN) .......................... 2017 1 1148866

(51) Int. Cl.
*G09G 3/36* (2006.01)
(52) U.S. Cl.
CPC ......... *G09G 3/3677* (2013.01); *G09G 3/3648* (2013.01); *G09G 2310/08* (2013.01)
(58) Field of Classification Search
CPC . G09G 3/3677; G09G 3/3648; G09G 2310/08
See application file for complete search history.

(56) References Cited

U.S. PATENT DOCUMENTS

| 9,659,540 | B1* | 5/2017 | Mei | .............. G09G 3/3648 |
| 2010/0150302 | A1* | 6/2010 | Tsai | .............. G11C 19/28 |
| | | | | 377/79 |
| 2014/0103983 | A1* | 4/2014 | Chang | .............. G09G 3/3655 |
| | | | | 327/198 |

(Continued)

FOREIGN PATENT DOCUMENTS

| CN | 106128380 A | 11/2016 |
| CN | 106128380 A1 * | 11/2016 |
| CN | 107331360 A | 11/2017 |

*Primary Examiner* — Nitin Patel
*Assistant Examiner* — Amy Onyekaba
(74) *Attorney, Agent, or Firm* — Hemisphere Law, PLLC; Zhigang Ma (57) ABSTRACT

The present invention provides a GOA circuit, which includes, which includes multi-stage GOA circuit repeat unit that are cascade connected, and each stage of the GOA circuit repeat units includes: a first pull-up control module (101), a first pull-down holding module (102), a first pull-down module (106), a first bootstrap capacitor module (103), a first output module (104), a second output module (105), a second pull-up control module (201), a second pull-down holding module (202), a second pull-down module (206), a second bootstrap capacitor module (203), a third output module (204) and a fourth output module (205). The present invention can reduce the number of thin film transistors (TFTs) in the GOA circuit for realizing a narrow-border design as well as reducing power consumption of the GOA circuit.

17 Claims, 2 Drawing Sheets

(56) References Cited

U.S. PATENT DOCUMENTS

| | | | |
|---|---|---|---|
| 2015/0279288 A1* | 10/2015 | Dai | G02F 1/13306 345/690 |
| 2015/0279289 A1* | 10/2015 | Yu | G11C 19/28 345/690 |
| 2016/0189649 A1* | 6/2016 | Xiao | G11C 19/28 345/214 |
| 2016/0248417 A1* | 8/2016 | Xiao | G09G 3/3677 |
| 2016/0260403 A1* | 9/2016 | Dai | G09G 3/36 |
| 2016/0275886 A1* | 9/2016 | Dai | G11C 19/28 |
| 2016/0284295 A1* | 9/2016 | Dai | G09G 3/3648 |
| 2016/0284296 A1* | 9/2016 | Dai | G09G 3/36 |
| 2016/0313620 A1* | 10/2016 | Dai | G02F 1/136259 |
| 2017/0236480 A1* | 8/2017 | Dai | G09G 3/3677 345/213 |
| 2017/0270886 A1* | 9/2017 | Yu | G09G 3/3677 |

\* cited by examiner

FIG. 1

FIG. 2 ially output an n-th scan signal Gn, an (n+2)th scan
GOA CIRCUIT

RELATED APPLICATIONS

The present application is a National Phase of International Application Number PCT/CN2017/113530, filed Nov. 29, 2017, and claims the priority of China Application No. 201711148866.7, filed Nov. 17, 2017.

FIELD OF THE DISCLOSURE

The present invention relates to a display technology field, and more particularly to a gate driver on array (GOA) circuit.

BACKGROUND

At present, a liquid crystal display (LCD) device, which functions as a display part of an electronic device, have been widely used in various electronic products, and a gate driver on array (GOA) is a driving method in which a gate line scanning driver circuit is made on an array substrate by utilizing a thin film transistor (TFT) LCD display array process. Therefore, the driving method of scanning the gate lines row-by-row is realized, and it has advantages of low manufacturing cost and narrow-border panel design and is therefore used by various types of displays.

Display panels based on low temperature poly-silicon (LTPS) technology may be catalogued into NMOS type, PMOS type and CMOS type that includes both of NMOS type and PMOS type according to the TFT type applied in the panels. Similarly, GOA circuits are catalogued into NMOS circuits, PMOS circuits and CMOS circuits. In comparison with the CMOS circuit, because the NMOS circuit saves a photomask and an operation of P-doping (i.e. phosphorus ion doping), it has great benefits of improving manufacture yield and reducing cost. Therefore, a stable NMOS circuit needs to be developed for the industries.

Nowadays developments of large-scale LCD display panels have become a main trend in the industries. However, the GOA circuit load increases with the increase of the number of gate driving lines and the panel size, and thus the size of each TFT in the GOA circuit and the panel border width increase, which is not beneficial of realizing narrow-border LCD display panels, and the power consumption of the GOA module also increases due to the increasing load.

SUMMARY

In order to solve the aforementioned technical problem, the present invention provides a gate driver on array (GOA) circuit with a reduced number of thin film transistors (TFTs) therein for realizing a narrow-border design as well as reducing power consumption thereof.

Correspondingly, embodiments of the present invention provides a GOA circuit for a liquid crystal display (LCD) panel, which includes: multi-stage GOA circuit repeat unit that are cascade connected, and each stage of the GOA circuit repeat units includes: a first pull-up control module 101, a first pull-down holding module 102, a first pull-down module 106, a first bootstrap capacitor module 103, a first output module 104, a second output module 105, a second pull-up control module 201, a second pull-down holding module 202, a second pull-down module 206, a second bootstrap capacitor module 203, a third output module 204 and a fourth output module 205; in which:

the first pull-up control module 101, first pull-down holding module 102, the first pull-down module 106, the first bootstrap capacitor module 103, the first output module 104 and the second output module 105 are all electrically connected to a first node Q(n); the second pull-up control module 201, the second pull-down holding module 202, the second pull-down module 206, the second bootstrap capacitor module 203, the third output module 204 and the fourth output module 205 are all electrically connected to a second node Q'(n);

m and n are all set to integers, and except a first stage GOA circuit repeat unit, in an n-th stage GOA circuit repeat unit:

the first output module 104, the second output module 105, the third output module 204 and the fourth output module 205 are respectively coupled to an m-th clock signal CKm, an (m+2)th clock signal CKm+2, an (m+4)th clock signal CKm+4 and an (m+6)th clock signal CKm+6 and sequentially output an n-th scan signal Gn, an (n+2)th scan signal Gn+2, an (n+4)th scan signal Gn+4 and an (n+6)th scan signal Gn+6 by respectively utilizing the m-th clock signal, the (m+2)th clock signal, the (m+4)th clock signal and the (m+6)th clock signal;

the first pull-up control module 101 is coupled to an (n−2)th scan signal Gn−2 that is outputted by a former (n−1)th stage GOA circuit repeat unit and uses the (n−2)th scan signal to charge the first node Q(n), so as to turn on the first output module and the second output module to perform scan signal outputting; the second pull-up control module 201 is coupled to the (n+2)th scan signal Gn+2 that is outputted by the n-th GOA circuit repeat unit and utilizes the (n+2)th scan signal to charge the second node Q'(n), so as to turn on the second output module and the third output module to perform scan signal outputting;

the first pull-down module 106 is coupled to at least the (n+4)th scan signal Gn+4 that is outputted by the n-th stage GOA circuit repeat unit and a constant low voltage level VGL and pulls down a voltage level of the first node under control of the (n+4)th scan signal, so as to turn off the first output module and the second output module; the second pull-down module 206 is coupled to at least an (n+8)th scan signal Gn+8 that is outputted by a latter (n+1)th stage GOA circuit repeat unit and the constant low voltage level VGL and pulls down a voltage level of the second node Q'(n) under control of the (n+8)th scan signal, so as to turn off the third output module and the fourth output module;

the first pull-down holding module 102 is coupled to at least a first scan control signal, a second scan control signal, the (m+4)th clock signal CKm+4, the (m+6)th clock signal CKm+6 and pulls down voltage levels of the n-th scan signal Gn and the (n+2)th scan signal Gn+2 under control of the first scan control signal, the second scan control signal, the (m+4)th clock signal, the (m+6)th clock signal and the first node; the second pull-down holding module 202 is coupled to at least the first scan control signal, the second scan control signal, the m-th clock signal CKm and the (m+2)th clock signal CKm+2 and pulls down voltage levels of the (n+4)th scan signal Gn+4 and the (n+6)th scan signal Gn+6 under control of the first scan control signal, the second scan control signal, the m-th clock signal, the (m+2)th clock signal and the second node;

the first scan control signal and the second scan control signal are phase-inverted.

In one embodiment, except the first stage GOA circuit repeat unit, in an n-th stage GOA circuit repeat unit:

the first pull-up control module 101 includes: a tenth TFT T10 and a tenth capacitor C10, in which a gate of the tenth TFT is coupled to an (n−2)th scan signal Gn−2 that is outputted by the former (n−1)th stage GOA circuit repeat unit, and a source of the tenth TFT is coupled to the first scan control signal, and a drain of tenth TFT is electrically connected to the first node Q(n); a terminal of the tenth capacitor C10 is coupled to the gate of the tenth TFT T10, and the other terminal of the tenth capacitor C10 is connected to the constant low voltage level:

the second pull-up control module 201 includes: a twentieth TFT T20 and a twentieth capacitor C20, in which a gate of the twentieth TFT is coupled to the (n+2)th scan signal Gn+2 that is outputted by the n-th stage GOA circuit repeat unit, and a source of the twentieth TFT is coupled to the first scan control signal, and a drain of the twentieth TFT is electrically coupled to the second node Q'(n); a terminal of the twentieth capacitor C20 is coupled to the gate of the twentieth TFT T20, and the other terminal of the twentieth capacitor C20 is connected to the constant low voltage level.

In one embodiment, in the first stage GOA circuit repeat unit, the gate of the tenth TFT T10 is coupled to a circuit start signal STV.

In one embodiment, the first output module 104 includes: a thirtieth TFT T30, a thirty-first TFT T31 and a thirty-second TFT T32, in which a source of the thirtieth TFT T30 is electrically coupled to the first node Q(n), and a gate of the thirtieth TFT T30 is connected to a constant high voltage level; a gate of the thirty-first TFT T31 is connected to a drain of the thirtieth TFT, and a drain of the thirty-first TFT T31 is coupled to the m-th clock signal CKm; a gate of the thirty-second TFT T32 is connected to the third node P(n), and a source of the thirty-second TFT T32 is connected to the constant low voltage level, and a drain of the thirty-second TFT T32 is connected with a drain of the thirty-first TFT T31 and is electrically connected to the n-th scan signal Gn that is outputted by the n-th stage GOA circuit repeat unit;

the second output module 105 includes: a thirty-third TFT T33, a thirty-fourth TFT T34 and a thirty-fifth TFT T35, in which a source of the thirty-third TFT T33 is electrically connected to the first node Q(n), and a gate of the thirty-third TFT T33 is connected to the constant high voltage level; a gate of the thirty-fourth TFT T34 is connected to a drain of the thirty-third TFT, and a drain of the thirty-fourth TFT T34 is coupled to the (m+2)th clock signal CKm+2; a gate of the thirty-fifth TFT T35 is connected to a fourth node P'(n), and a source of the thirty-fifth TFT T35 is connected to the constant low voltage level, and a drain of the thirty-fifth TFT T35 is connected with a source of the thirty-fourth TFT T34 and is electrically connected to the (n+2)th scan signal Gn+2 that is outputted by the n-th stage GOA circuit repeat unit;

the third output module 204 includes: a fortieth TFT T40, a forty-first TFT T41 and a forty-second TFT T42, in which a source of the fortieth TFT T40 is electrically connected to the second node Q'(n), and a gate of the fortieth TFT T40 is connected to the constant high voltage level; a gate of the forty-first TFT T41 is connected to a drain of the fortieth TFT, and a drain of the forty-first TFT T41 is coupled to the (m+4)th clock signal CKm+4; a gate of the forty-second TFT T42 is connected to the fourth node P'(n), and a source of the forty-second TFT T42 is connected to the constant low voltage level, and a drain of the forty-second TFT T42 is connected with the forty-first TFT T41 and is electrically connected to the (n+4)th scan signal Gn+4 that is outputted by the n-th stage GOA circuit repeat unit; and the fourth output module 205 includes: a forty-third TFT T43, a forty-fourth TFT T44 and a forty-fifth TFT T45, in which a source of the forty-third TFT T43 is electrically connected to the second node Q'(n), and a gate of the forty-third TFT T43 is connected to the constant high voltage level; a gate of the forty-fourth TFT T44 is connected to a drain of the forty-third TFT, and a drain of the forty-fourth TFT T44 is coupled to the (m+6)th clock signal CKm+6; a gate of the forty-fifth TFT T45 is connected to the fourth node P'(n), and a source of the forty-fifth TFT T45 is connected to the constant low voltage level, and a drain of the forty-fifth TFT T45 is connected with a source of the forty-fourth TFT T44 and is electrically connected to the (n+6)th scan signal Gn+6 that is outputted by the n-th stage GOA circuit repeat unit.

In one embodiment, the first pull-down module 106 includes: a fourteenth TFT T14, a fifteenth TFT T15 and a sixteenth TFT T16, in which a gate of the fourteenth TFT T14 is coupled to the (n+4)th scan signal Gn+4 that is outputted by the n-th stage GOA circuit repeat unit, and a drain of the fourteenth TFT T14 is coupled to the second scan control signal, and a source of the fourteenth TFT T14 is electrically connected to the first node Q(n); a gate of the fifteenth TFT T15 is electrically connected to the first node Q(n), and a drain of the fifteenth TFT T15 is connected to the constant low voltage level, and a source of the fifteenth TFT T15 is connected to a third node P(n); a gate of the sixteenth TFT T16 is connected to the third node P(n), and a drain of the sixteenth TFT T16 is connected to the first node Q(n), and a source of the sixteenth TFT T16 is connected to the constant low voltage level;

the second pull-down module 206 includes: a twenty-fourth TFT T24, a twenty-fifth TFT T25 and a twenty-sixth TFT T26, in which a gate of the twenty-fourth TFT T24 is coupled to the (n+8)th scan signal Gn+8 that is outputted by the latter (n+1)th stage GOA circuit repeat unit, and a drain of the twenty-fourth TFT T24 is coupled to the second scan control signal, and a source of the twenty-fourth TFT T24 is electrically coupled to the second node Q'(n); a gate of the twenty-fifth TFT T25 is electrically coupled to the second node Q'(n), and a drain of the twenty-fifth TFT T25 is connected to the constant low voltage level, and a source of the twenty-fifth TFT T25 is connected to a fourth node P'(n); a gate of the twenty-sixth TFT T26 is connected to the fourth node P'(n), and a drain of the twenty-sixth TFT T26 is connected to the second node Q'(n), and a source of the twenty-sixth TFT T26 is connected to the constant low voltage level.

In one embodiment, the first pull-down module 106 further includes an eleventh capacitor C11, in which a terminal of the eleventh capacitor C11 is coupled to the constant low voltage level, and the other terminal of the eleventh capacitor C11 is connected to the gate of the fourteenth TFT T14;

the second pull-down module 206 further includes a twenty-first capacitor C21, in which a terminal of the twenty-first capacitor C21 is coupled to the constant low voltage level, and the other terminal of the twenty-first capacitor C21 is connected to the gate of the twenty-fourth TFT T24.

In one embodiment, the first pull-down holding module 102 includes: an eleventh TFT T11, a twelfth TFT T12 and a thirteenth TFT T13, in which a gate of the eleventh TFT T11 is coupled to the first scan control signal, and a drain of the eleventh TFT T11 is coupled to the (m+4)th clock signal CKm+4; a gate of the twelfth TFT T12 is coupled to the second scan control signal, and a source of the twelfth TFT T12 is coupled to the (m+6)th clock signal CKm+6; a gate of the thirteenth TFT T13 is connected with a source of the eleventh TFT T11 and a drain of the twelfth TFT T12, and a drain of the thirteenth TFT T13 is coupled to a constant high voltage level, and a source of the thirteenth TFT T13 is connected to a third node P(n); and the second pull-down holding module 202 includes: a twenty-first TFT T21, a twenty-second TFT T22 and a twenty-third TFT T23, in which a gate of the twenty-first TFT T21 is coupled to the first scan control signal, and a drain of the twenty-first TFT T21 is coupled to m-th clock signal CKm; a gate of the twenty-second TFT T22 is coupled to the second scan control signal, and a source of the twenty-second TFT T22 is coupled to the (m+2)th clock signal CKm+2; a gate of the twenty-third TFT T23 is connected with a source of the twenty-first TFT T21 and a drain of the twenty-second TFT T22, and a drain of the twenty-third TFT T23 is coupled to the constant high voltage level, and a source of the twenty-third TFT T23 is connected to a fourth node P'(n).

In one embodiment, the first bootstrap capacitor module 103 includes a twelfth capacitor C12 and a thirteenth capacitor C13, in which a terminal of the twelfth capacitor C12 is connected to the first node Q(n), and the other terminal of the twelfth capacitor C12 is connected to the constant low voltage level; a terminal of the thirteenth capacitor C13 is connected to a third node P(n), and the other terminal of the thirteenth capacitor C13 is connected to the constant low voltage level;

the second bootstrap capacitor module 203 includes a twenty-second capacitor C22 and a twenty-third capacitor C23, in which a terminal of the twenty-second capacitor C22 is connected to the second node Q'(n), and the other terminal of the twenty-second capacitor C22 is connected to the constant low voltage level; a terminal of the twenty-third capacitor C23 is connected to a fourth node P'(n), and the other terminal of the twenty-third capacitor C23 is constant low voltage level.

In one embodiment, all of the TFTs are N-channel TFTs.

The embodiments of the present invention has the following beneficial effects:

In summary, the present invention provides a GOA circuit design, in which four neighboring stages of GOA units in a traditional GOA circuit constitute a GOA circuit repeat unit, and in the GOA circuit repeat unit, the first two stages of GOA units commonly use a control node and commonly use a pull-up control module, a pull-down module and a pull-down holding module, and the last two stages of GOA units commonly uses another control node and commonly use a pull-up control module, a pull-down module and a pull-down holding module, such that the number of TFTs in the GOA circuit can be reduced, and the wiring layout design can be simplified, which benefits reducing the GOA circuit design space, so as to realize narrow-border design, and concurrently the power consumption of the GOA circuit can be reduced because of the simplified GOA circuit;

Further, filtering capacitors are added in the first pull-up control module and the second pull-up control module, which is capable of making the scan signals of the first pull-up control module and the second pull-up control module more smooth, and thus the effect of high-frequency coupling in the active area (AA) of the display panel on the GOA circuit can be reduced, and the stability of the GOA circuit can be enhanced.

BRIEF DESCRIPTION OF THE DRAWINGS

To more clearly explain the technical solutions proposed in embodiments of the present invention or those of the prior art, a brief description of the drawings that are necessary for describing the embodiments of the present invention or those of the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF PREFERRED EMBODIMENTS

A clear and complete description will be given to technical solutions of the embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Here, it is also worthy to note that, in order to prevent the present disclosure from being obscured due to unnecessary details, the drawings only illustrate the structure and/or processing steps closely related to the technical solution of the present disclosure, while other details less related to the present disclosure are omitted.

Figure 1:
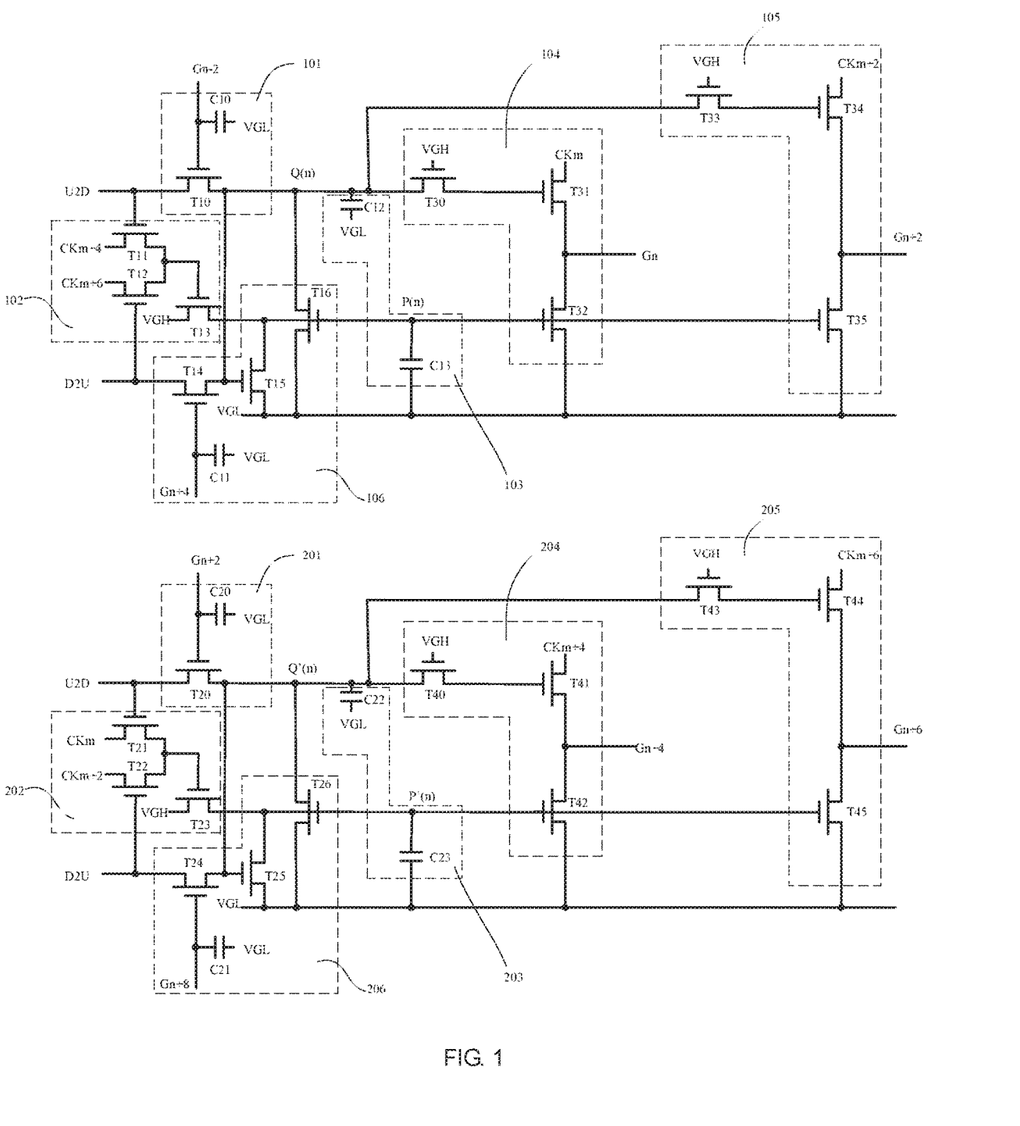
FIG. 1 is a circuit diagram of an n-th stage GOA circuit repeat unit of a GOA circuit provided by an embodiment of the present invention.

FIG. 1 shows a circuit diagram of an n-th stage gate driver on array (GOA) circuit repeat unit of a GOA circuit provided by an embodiment of the present invention. In the embodiment, the GOA circuit is used in a liquid crystal display (LCD) panel and includes: multi-stage GOA circuit repeat units that are cascade connected, and each stage of the GOA circuit repeat units includes: a first pull-up control module 101, a first pull-down holding module 102, a first pull-down module 106, a first bootstrap capacitor module 103, a first output module 104, a second output module 105, a second pull-up control module 201, a second pull-down holding module 202, a second pull-down module 206, a second bootstrap capacitor module 203, a third output module 204 and a fourth output module 205; in which:

the first pull-up control module 101, the first pull-down holding module 102, the first pull-down module 106, the first bootstrap capacitor module 103, the first output module 104 and the second output module 105 are all electrically connected to a first node Q(n); the second pull-up control module 201, the second pull-down holding module 202, the second pull-down module 206, the second bootstrap capacitor module 203, the third output module 204 and the fourth output module 205 are all electrically connected to a second node Q'(n);

m and n are all set to integers, and except a first stage GOA circuit repeat unit, in the n-th stage GOA circuit repeat unit:

the first output module 104, the second output module 105, the third output module 204 and the fourth output module 205 are respectively coupled to an m-th clock signal CKm, an (m+2)th clock signal CKm+2, an (m+4)th clock signal CKm+4 and an (m+6)th clock signal CKm+6 and sequentially output an n-th scan signal Gn, an (n+2)th scan signal Gn+2, an (n+4)th scan signal Gn+4 and an (n+6)th scan signal Gn+6 by respectively utilizing the m-th clock signal CKm, the (m+2)th clock signal CKm+2, the (m+4)th clock signal CKm+4 and the (m+6)th clock signal CKm+6;

the first pull-up control module 101 is coupled to an (n−2)th scan signal Gn−2 that is outputted by a former (n−1)th stage GOA circuit repeat unit and uses the (n−2)th scan signal Gn−2 to charge the first node Q(n), so as to turn on the first output module 104 and the second output module 105 to perform scan signal outputting; the second pull-up control module 201 is coupled to the (n+2)th scan signal Gn+2 that is outputted by the n-th GOA circuit repeat unit and utilizes the (n+2)th scan signal Gn+2 to charge the second node Q'(n), so as to turn on the second output module 105 and the third output module 204 to perform scan signal outputting;

the first pull-down module 106 is coupled to at least the (n+4)th scan signal Gn+4 that is outputted by the n-th stage GOA circuit repeat unit and a constant low voltage level VGL and pulls down a voltage level of the first node Q(n) under control of the (n+4)th scan signal Gn+4, so as to turn off the first output module 104 and the second output module 105; the second pull-down module 206 is coupled to at least an (n+8)th scan signal Gn+8 that is outputted by a latter (n+1)th stage GOA circuit repeat unit and the constant low voltage level VGL and pulls down a voltage level of the second node Q'(n) under control of the (n+8)th scan signal Gn+8, so as to turn off the third output module 204 and the fourth output module 205;

the first pull-down holding module 102 is coupled to at least a first scan control signal (e.g. a non-inverting scan control signal U2D), a second scan control signal (e.g. an inverting scan control signal D2U), the (m+4)th clock signal CKm+4, the (m+6)th clock signal CKm+6 and pulls down voltage levels of the n-th scan signal Gn and the (n+2)th scan signal Gn+2 under control of the first scan control signal, the second scan control signal, the (m+4)th clock signal CKm+4, the (m+6)th clock signal CKm+6 and the first node Q(n); the second pull-down holding module 202 is coupled to at least the first scan control signal, the second scan control signal, the m-th clock signal CKm and the (m+2)th clock signal CKm+2 and pulls down voltage levels of the (n+4)th scan signal Gn+4 and the (n+6)th scan signal Gn+6 under control of the first scan control signal, the second scan control signal, the m-th clock signal CKm, the (m+2)th clock signal CKm+2 and the second node Q'(n);

the first scan control signal and the second scan control signal are phase-inverted.

In one embodiment, except the first stage GOA circuit repeat unit, in the n-th stage GOA circuit repeat unit:

the first pull-up control module 101 includes: a tenth TFT T10 and a tenth capacitor C10, in which a gate of the tenth TFT T10 is coupled to an (n−2)th scan signal Gn−2 that is outputted by the former (n−1)th stage GOA circuit repeat unit, and a source of the tenth TFT T10 is coupled to the first scan control signal, and a drain of tenth TFT T10 is electrically connected to the first node Q(n); a terminal of the tenth capacitor C10 is coupled to the gate of the tenth TFT T10, and the other terminal of the tenth capacitor C10 is connected to the constant low voltage level;

the second pull-up control module 201 includes: a twentieth TFT T20 and a twentieth capacitor C20, wherein a gate of the twentieth TFT T20 is coupled to the (n+2)th scan signal Gn+2 that is outputted by the n-th stage GOA circuit repeat unit, and a source of the twentieth TFT T20 is coupled to the first scan control signal, and a drain of the twentieth TFT T20 is electrically coupled to the second node Q'(n); a terminal of the twentieth capacitor C20 is coupled to the gate of the twentieth TFT T20, and the other terminal of the twentieth capacitor C20 is connected to the constant low voltage level.

It is understood that, the tenth capacitor C10 and the twentieth capacitor C20 are respectively arranged in first pull-up control module 101 and the second pull-up control module 201 and are all filtering capacitors, which is capable of making the scan signals entering the tenth TFT T10 and the twentieth TFT T20 more smooth, and thus the effect of high-frequency coupling in the active area (AA) of the display panel on the GOA circuit can be reduced, and the stability of the GOA circuit can be enhanced.

It is understood that in the first stage GOA circuit repeat unit, the gate of the tenth TFT T10 is coupled to a circuit start signal STV.

In one embodiment, the first output module 104 includes: a thirtieth TFT T30, a thirty-first TFT T31 and a thirty-second TFT T32, in which a source of the thirtieth TFT T30 is electrically coupled to the first node Q(n), and a gate of the thirtieth TFT T30 is connected to a constant high voltage level; a gate of the thirty-first TFT T31 is connected to a drain of the thirtieth TFT T30, and a drain of the thirty-first TFT T31 is coupled to the m-th clock signal CKm; a gate of the thirty-second TFT T32 is connected to the third node P(n), and a source of the thirty-second TFT T32 is connected to the constant low voltage level, and a drain of the thirty-second TFT T32 is connected with a drain of the thirty-first TFT T31 and is electrically connected to the n-th scan signal Gn that is outputted by the n-th stage GOA circuit repeat unit;

the second output module 105 includes: a thirty-third TFT T33, a thirty-fourth TFT T34 and a thirty-fifth TFT T35, in which a source of the thirty-third TFT T33 is electrically connected to the first node Q(n), and a gate of the thirty-third TFT T33 is connected to the constant high voltage level; a gate of the thirty-fourth TFT T34 is connected to a drain of the thirty-third TFT, and a drain of the thirty-fourth TFT T34 is coupled to the (m+2)th clock signal CKm+2; a gate of the thirty-fifth TFT T35 is connected to a fourth node P'(n), and a source of the thirty-fifth TFT T35 is connected to the constant low voltage level, and a drain of the thirty-fifth TFT T35 is connected with a source of the thirty-fourth TFT T34 and is electrically connected to the (n+2)th scan signal Gn+2 that is outputted by the n-th stage GOA circuit repeat unit;

the third output module 204 includes: a fortieth TFT T40, a forty-first TFT T41 and a forty-second TFT T42, in which a source of the fortieth TFT T40 is electrically connected to the second node Q'(n), and a gate of the fortieth TFT T40 is connected to the constant high voltage level; a gate of the forty-first TFT T41 is connected to a drain of the fortieth TFT T40, and a drain of the forty-first TFT T41 is coupled to the (m+4)th clock signal CKm+4; a gate of the forty-second TFT T42 is connected to the fourth node P'(n), and a source of the forty-second TFT T42 is connected to the constant low voltage level, and a drain of the forty-second TFT T42 is connected with the forty-first TFT T41 and is electrically connected to the (n+4)th scan signal Gn+4 that is outputted by the n-th GOA circuit repeat unit;

the fourth output module 205 includes: a forty-third TFT T43, a forty-fourth TFT T44 and a forty-fifth TFT T45, in which a source of the forty-third TFT T43 is electrically connected to the second node Q'(n), and a gate of the forty-third TFT T43 is connected to the constant high voltage level; a gate of the forty-fourth TFT T44 is connected to a drain of the forty-third TFT, and a drain of the forty-fourth TFT T44 is coupled to the (m+6)th clock signal CKm+6; a gate of the forty-fifth TFT T45 is connected to the fourth node P'(n), and a source of the forty-fifth TFT T45 is connected to the constant low voltage level, and a drain of the forty-fifth TFT T45 is connected with a source of the forty-fourth TFT T44 and is electrically connected to the (n+6)th scan signal Gn+6 that is outputted by the n-th stage GOA circuit repeat unit.

In one embodiment, the first pull-down module 106 includes: a fourteenth TFT T14, a fifteenth TFT T15 and a sixteenth TFT T16, in which a gate of the fourteenth TFT T14 is coupled to the (n+4)th scan signal Gn+4 that is outputted by the n-th stage GOA circuit repeat unit, and a drain of the fourteenth TFT T14 is coupled to the second scan control signal, and a source of the fourteenth TFT T14 is electrically connected to the first node Q(n); a gate of the fifteenth TFT T15 is electrically connected to the first node Q(n), and a drain of the fifteenth TFT T15 is connected to the constant low voltage level, and a source of the fifteenth TFT T15 is connected to a third node P(n); a gate of the sixteenth TFT T16 is connected to the third node P(n), and a drain of the sixteenth TFT T16 is connected to the first node Q(n), and a source of the sixteenth TFT T16 is connected to the constant low voltage level;

the second pull-down module 206 includes: a twenty-fourth TFT T24, a twenty-fifth TFT T25 and a twenty-sixth TFT T26, in which a gate of the twenty-fourth TFT T24 is coupled to the (n+8)th scan signal Gn+8 that is outputted by the latter (n+1)th stage GOA circuit repeat unit, and a drain of the twenty-fourth TFT T24 is coupled to the second scan control signal, and a source of the twenty-fourth TFT T24 is electrically coupled to the second node Q'(n); a gate of the twenty-fifth TFT T25 is electrically coupled to the second node Q'(n), and a drain of the twenty-fifth TFT T25 is connected to the constant low voltage level, and a source of the twenty-fifth TFT T25 is connected to a fourth node P'(n); a gate of the twenty-sixth TFT T26 is connected to the fourth node P'(n), and a drain of the twenty-sixth TFT T26 is connected to the second node Q'(n), and a source of the twenty-sixth TFT T26 is connected to the constant low voltage level.

In one embodiment, the first pull-down module 106 further includes an eleventh capacitor C11, in which a terminal of the eleventh capacitor C11 is coupled to the constant low voltage level, and the other terminal of the eleventh capacitor C11 is connected to the gate of the fourteenth TFT T14;

the second pull-down module 206 further includes a twenty-first capacitor C21, in which a terminal of the twenty-first capacitor C21 is coupled to the constant low voltage level, and the other terminal of the twenty-first capacitor C21 is connected to the gate of the twenty-fourth TFT T24.

In one embodiment, the first pull-down holding module 102 includes: an eleventh TFT T11, a twelfth TFT T12 and a thirteenth TFT T13, in which a gate of the eleventh TFT T11 is coupled to the first scan control signal, and a drain of the eleventh TFT T11 is coupled to the (m+4)th clock signal CKm+4; a gate of the twelfth TFT T12 is coupled to the second scan control signal, and a source of the twelfth TFT T12 is coupled to the (m+6)th dock signal CKm+6; a gate of the thirteenth TFT T13 is connected with a source of the eleventh TFT T11 and a drain of the twelfth TFT T12, and a drain of the thirteenth TFT T13 is coupled to a constant high voltage level, and a source of the thirteenth TFT T13 is connected to a third node P(n);

the second pull-down holding module 202 includes: a twenty-first TFT T21, a twenty-second TFT T22 and a twenty-third TFT T23, in which a gate of the twenty-first TFT T21 is coupled to the first scan control signal, and a drain of the twenty-first TFT T21 is coupled to m-th clock signal CKm; a gate of the twenty-second TFT T22 is coupled to the second scan control signal, and a source of the twenty-second TFT T22 is coupled to the (m+2)th clock signal CKm+2; a gate of the twenty-third TFT T23 is connected with a source of the twenty-first TFT T21 and a drain of the twenty-second TFT T22, and a drain of the twenty-third TFT T23 is coupled to the constant high voltage level, and a source of the twenty-third TFT T23 is connected to a fourth node P'(n).

In one embodiment, the first bootstrap capacitor module 103 includes a twelfth capacitor C12 and a thirteenth capacitor C13, in which a terminal of the twelfth capacitor C12 is connected to the first node Q(n), and the other terminal of the twelfth capacitor C12 is connected to the constant low voltage level; a terminal of the thirteenth capacitor C13 is connected to the third node P(n), and the other terminal of the thirteenth capacitor C13 is connected to the constant low voltage level;

The second bootstrap capacitor module 203 includes a twenty-second capacitor C22 and a twenty-third capacitor C23, in which a terminal of the twenty-second capacitor C22 is connected to the second node Q'(n), and the other terminal of the twenty-second capacitor C22 is connected to the constant low voltage level; a terminal of the twenty-third capacitor C23 is connected to the fourth node P'(n), and the other terminal of the twenty-third capacitor C23 is connected to constant low voltage level.

It is understood that, in the abovementioned description, in one example, the TFTs are all N-channel TFTs, and the drain and the source of each of the TFTs is interchangeable.

It is understood that the GOA circuit of the present invention may not only apply a forward scanning status of the LCD panel (i.e., the voltage level of the first scan control signal U2D is high and the voltage level of the second scan control signal D2U is low) but also apply a backward scanning status of the LCD panel (i.e., the voltage level of the first scan control signal U2D is low, and the voltage level of the second scan control signal D2U is high), so as to realize sequentially turning on the TFTs in the pixel units row-by-row.

Figure 2:
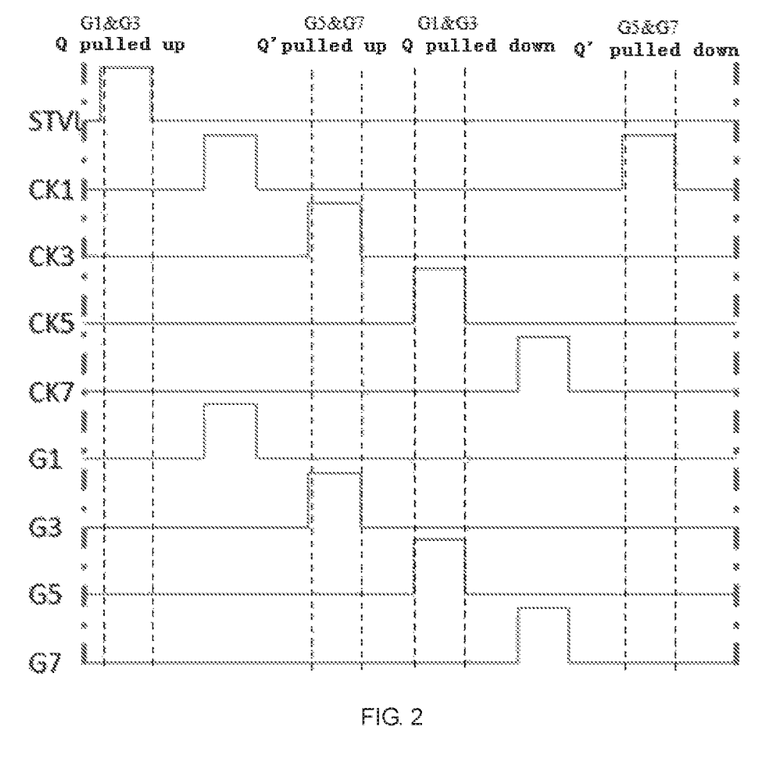
FIG. 2 is a time sequential diagram of various signals of a first stage GOA circuit repeat unit in FIG. 1.

FIG. 2 shows a time sequential diagram of various signals of the first stage GOA circuit repeat unit in FIG. 1.

As can be seen from FIG. 2, when a forward scanning process is performed (i.e., the voltage level of the first scan control signal U2D is high and the voltage level of the second scan control signal D2U is low), and simultaneously both of n and m in the circuit diagram are assigned to be 1. At this time, the signal which is connected to the gate of the TFT T10 is the circuit start signal STV, when the voltage level of the circuit start signal STV is high, the TFT T10 is conducted, and the voltage level of Q(n) is pulled up, when the voltage level of CK1 (i.e. CKm) is high, the TFT T31 is conducted, and G1 (i.e. Gn) is outputted at a high voltage level; when the voltage level of CK3 (i.e. CKm+2) is high, the TFT T34 is conducted, and G3 (i.e. Gn+2) is outputted at a high voltage level;

Similarly, when the voltage level of G3 (i.e. Gn+2) is high, the TFT T20 is conducted, and the voltage level of Q'(n) is pulled up, when the voltage level of CK5 (i.e. CKm+4) is high, the TFT T41 is conducted, and G5 (i.e. Gn+4) is outputted at a high voltage level; when the voltage level of CK7 (i.e. CKm+6) is high, the TFT T44 is conducted, and G7 (i.e. Gn+6) is outputted at a high voltage level.

Simultaneously, when the voltage level of CK5 is high, the TFTs T11, T13 and T16 are conducted, thereby pulling down Q(n) to be at a low voltage level; when the voltage level of CK1 becomes high again, the TFTs T21, T23 and T26 are conducted, thereby pulling down the voltage level of Q'(n) to be at a low voltage level.

Therefore, sequentially turning on of G1 (i.e. Gn), G3 (i.e. Gn+2), G5 (i.e. Gn+4), G7 (i.e. Gn+6) row-by-row can be realized.

It is understood that the principle of the other stage GOA circuit repeat units are approximately similar to that mentioned above and thus is not described in detail herein.

In summary, the present invention provides a GOA circuit design, in which four neighboring stages of GOA units in a traditional GOA circuit constitute a GOA circuit repeat unit, and in the GOA circuit repeat unit, the first two stages of GOA units commonly use a control node and commonly use a pull-up control module, a pull-down module and a pull-down holding module, and the last two stages of GOA units commonly uses another control node and commonly use a pull-up control module, a pull-down module and a pull-down holding module, such that the number of TFTs in the GOA circuit can be reduced, and the wiring layout design can be simplified, which benefits reducing the GOA circuit design space, so as to realize narrow-border design, and concurrently the power consumption of the GOA circuit can be reduced because of the simplified GOA circuit;

Further, filtering capacitors are added in the first pull-up control module and the second pull-up control module, which is capable of making the scan signals of the first pull-up control module and the second pull-up control module more smooth, and thus the effect of high-frequency coupling in the active area (AA) of the display panel on the GOA circuit can be reduced, and the stability of the GOA circuit can be enhanced.

It should be explained that the relationship terms, such as first and second, etc., in the present application are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors, but also includes other factors that are not explicitly listed, or further include inherent factors for this process, method, object or device. In a case of no more limitations being provided, the factors defined by the expression "include one . . . " do not exclude additional identical factors existing in the process, method, object or device which includes the factors.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A gate driver on array (GOA) circuit for a liquid crystal display (LCD) panel, the GOA circuit comprising multi-stage GOA circuit repeat units that are cascade connected, and each stage of the GOA circuit repeat units comprising: a first pull-up control module (101), a first pull-down holding module (102), a first pull-down module (106), a first bootstrap capacitor module (103), a first output module (104), a second output module (105), a second pull-up control module (201), a second pull-down holding module (202), a second pull-down module (206), a second bootstrap capacitor module (203), a third output module (204) and a fourth output module (205); wherein:

the first pull-up control module (101), the first pull-down holding module (102), the first pull-down module (106), the first bootstrap capacitor module (103), the first output module (104) and the second output module (105) are all electrically connected to a first node (Q(n)); the second pull-up control module (201), the second pull-down holding module (202), the second pull-down module (206), the second bootstrap capacitor module (203), the third output module (204) and the fourth output module (205) are all electrically connected to a second node (Q'(n)); and m and n are all set to integers, and except a first stage GOA circuit repeat unit, in an n-th stage GOA circuit repeat unit:

the first output module (104), the second output module (105), the third output module (204) and the fourth output module (205) are respectively coupled to an m-th clock signal (CKm), an (m+2)th clock signal (CKm+2), an (m+4)th clock signal (CKm+4) and an (m+6)th clock signal (CKm+6) and sequentially output an n-th scan signal (Gn), an (n+2)th scan signal (Gn+2), an (n+4)th scan signal (Gn+4) and an (n+6)th scan signal (Gn+6) by respectively utilizing the m-th clock signal (CKm), the (m+2)th clock signal (CKm+2), the (m+4)th clock signal (CKm+4) and the (m+6)th clock signal (CKm+6);

the first pull-up control module (101) is coupled to an (n−2)th scan signal (Gn−2) that is outputted by a former (n−1)th stage GOA circuit repeat unit and uses the (n−2)th scan signal to charge the first node (Q(n)), so as to turn on the first output module and the second output module to perform scan signal outputting; the second pull-up control module (201) is coupled to the (n+2)th scan signal (Gn+2) that is outputted by the n-th GOA circuit repeat unit and utilizes the (n+2)th scan signal to charge the second node (Q'(n)), so as to turn on the second output module and the third output module to perform scan signal outputting;

the first pull-down module (106) is coupled to at least the (n+4)th scan signal (Gn+4) that is outputted by the n-th stage GOA circuit repeat unit and a constant low voltage level (VGL) and pulls down a voltage level of the first node under control of the (n+4)th scan signal, so as to turn off the first output module and the second output module; the second pull-down module (206) is coupled to at least an (n+8)th scan signal (Gn+8) that is outputted by a latter (n+1)th stage GOA circuit repeat unit and the constant low voltage level (VGL) and pulls down a voltage level of the second node (Q'(n)) under control of the (n+8)th scan signal, so as to turn off the third output module and the fourth output module;

the first pull-down holding module (102) is coupled to at least a first scan control signal, a second scan control signal, the (m+4)th clock signal (CKm+4), the (m+6)th clock signal (CKm+6) and pulls down voltage levels of the n-th scan signal (Gn) and the (n+2)th scan signal (Gn+2) under control of the first scan control signal, the second scan control signal, the (m+4)th clock signal, the (m+6)th clock signal and the first node; the second pull-down holding module (202) is coupled to at least the first scan control signal, the second scan control signal, the m-th clock signal (CKm) and the (m+2)th clock signal (CKm+2) and pulls down voltage levels of the (n+4)th scan signal (Gn+4) and the (n+6)th scan signal (Gn+6) under control of the first scan control signal, the second scan control signal, the m-th clock signal, the (m+2)th clock signal and the second node; and the first scan control signal and the second scan control signal are phase-inverted.

2. The GOA circuit as claimed in claim 1, wherein, except the first stage GOA circuit repeat unit, in an n-th stage GOA circuit repeat unit:

the first pull-up control module (101) comprises: a tenth TFT (T10) and a tenth capacitor (C10), wherein a gate of the tenth TFT is coupled to an (n−2)th scan signal (Gn−2) that is outputted by the former (n−1)th stage GOA circuit repeat unit, and a source of the tenth TFT is coupled to the first scan control signal, and a drain of tenth TFT is electrically connected to the first node (Q(n)); a terminal of the tenth capacitor (C10) is coupled to the gate of the tenth TFT (T10), and the other terminal of the tenth capacitor (C10) is connected to the constant low voltage level; and the second pull-up control module (201) comprises: a twentieth TFT (T20) and a twentieth capacitor (C20), wherein a gate of the twentieth TFT (T20) is coupled to the (n+2)th scan signal (Gn+2) that is outputted by the n-th stage GOA circuit repeat unit, and a source of the twentieth TFT (T20) is coupled to the first scan control signal, and a drain of the twentieth TFT (T20) is electrically coupled to the second node (Q'(n)); a terminal of the twentieth capacitor (C20) is coupled to the gate of the twentieth TFT (T20), and the other terminal of the twentieth capacitor (C20) is connected to the constant low voltage level.

3. The GOA circuit as claimed in claim 2, wherein in the first stage GOA circuit repeat unit, the gate of the tenth TFT (T10) is coupled to a circuit start signal (STV).

4. The GOA circuit as claimed in claim 1, wherein the first output module (104) comprises: a thirtieth TFT (T30), a thirty-first TFT (T31) and a thirty-second TFT (T32), wherein a source of the thirtieth TFT (T30) is electrically connected to the first node Q(n), and a gate of the thirtieth TFT (T30) is connected to a constant high voltage level; a gate of the thirty-first TFT (T31) is connected to a drain of the thirtieth TFT, and a drain of the thirty-first TFT (T31) is coupled to the m-th clock signal (CKm); a gate of the thirty-second TFT (T32) is connected to a third node (P(n)), and a source of the thirty-second TFT (T32) is connected to the constant low voltage level, and a drain of the thirty-second TFT (T32) is connected with a source of the thirty-first TFT (T31) and is electrically connected to the n-th scan signal (Gn) that is outputted by the n-th stage GOA circuit repeat unit;

the second output module (105) comprises: a thirty-third TFT (T33), a thirty-fourth TFT (T34) and a thirty-fifth TFT (T35), wherein a source of the thirty-third TFT (T33) is electrically connected to the first node (Q(n)), and a gate of the thirty-third TFT (T33) is connected to the constant high voltage level; a gate of the thirty-fourth TFT (T34) is connected to a drain of the thirty-third TFT, and a drain of the thirty-fourth TFT (T34) is coupled to the (m+2)th clock signal (CKm+2); a gate of the thirty-fifth TFT (T35) is connected to a fourth node (P'(n)), and a source of the thirty-fifth TFT (T35) is connected to the constant low voltage level, and a drain of the thirty-fifth TFT (T35) is connected with a source of the thirty-fourth TFT (T34) and is electrically connected to the (n+2)th scan signal (Gn+2) that is outputted by the n-th stage GOA circuit repeat unit;

the third output module (204) comprises: a fortieth TFT (T40), a forty-first TFT (T41) and a forty-second TFT (T42), wherein a source of the fortieth TFT (T40) is electrically connected to the second node (Q'(n)), and a gate of the fortieth TFT (T40) is connected to the constant high voltage level; a gate of the forty-first TFT (T41) is connected to a drain of the fortieth TFT, and a drain of the forty-first TFT (T41) is coupled to the (m+4)th clock signal (CKm+4); a gate of the forty-second TFT (T42) is connected to the fourth node (P'(n)), and a source of the forty-second TFT (T42) is connected to the constant low voltage level, and a drain of the forty-second TFT (T42) is connected with a source of the forty-first TFT (T41) and is electrically connected to the (n+4)th scan signal (Gn+4) that is outputted by the n-th GOA circuit repeat unit; and the fourth output module (205) comprises: a forty-third TFT (T43), a forty-fourth TFT (T44) and a forty-fifth TFT (T45), wherein a source of the forty-third TFT (T43) is electrically connected to the second node (Q'(n)), and a gate of the forty-third TFT (T43) is connected to the constant high voltage level; a gate of the forty-fourth TFT (T44) is connected to a drain of the forty-third TFT, and a drain of the forty-fourth TFT (T44) is coupled to the (m+6)th clock signal (CKm+6); a gate of the forty-fifth TFT (T45) is connected to the fourth node (P'(n)), and a source of the forty-fifth TFT (T45) is connected to the constant low voltage level, and a drain of the forty-fifth TFT (T45) is connected with a source of the forty-fourth TFT (T44) and is electrically connected to the (n+6)th scan signal (Gn+6) that is outputted by the n-th stage GOA circuit repeat unit.

5. The GOA circuit as claimed in claim 1, wherein the first pull-down module (106) comprises: a fourteenth TFT (T14), a fifteenth TFT (T15) and a sixteenth TFT (T16), wherein a gate of the fourteenth TFT (T14) is coupled to the (n+4)th scan signal (Gn+4) that is outputted by the n-th stage GOA circuit repeat unit, and a drain of the fourteenth TFT (T14) is coupled to the second scan control signal, and a source of the fourteenth TFT (T14) is electrically connected to the first node (Q(n)); a gate of the fifteenth TFT (T15) is electrically connected to the first node (Q(n)), and a drain of the fifteenth TFT (T15) is connected to the constant low voltage level, and a source of the fifteenth TFT (T15) is connected to a third node (P(n)); a gate of the sixteenth TFT (T16) is connected to the third node (P(n)), and a drain of the sixteenth TFT (T16) is connected to the first node (Q(n)), and a source of the sixteenth TFT (T16) is connected to the constant low voltage level; and the second pull-down module (206) comprises: a twenty-fourth TFT (T24), a twenty-fifth TFT (T25) and a twenty-sixth TFT (T26), wherein a gate of the twenty-fourth TFT (T24) is coupled to the (n+8)th scan signal (Gn+8) that is outputted by the latter (n+1)th stage GOA circuit repeat unit, and a drain of the twenty-fourth TFT (T24) is coupled to the second scan control signal, and a source of the twenty-fourth TFT (T24) is electrically coupled to the second node (Q'(n)); a gate of the twenty-fifth TFT (T25) is electrically coupled to the second node (Q'(n)), and a drain of the twenty-fifth TFT (T25) is connected to the constant low voltage level, and a source of the twenty-fifth TFT (T25) is connected to a fourth node (P'(n)); a gate of the twenty-sixth TFT (T26) is connected to the fourth node (P'(n)), and a drain of the twenty-sixth TFT (T26) is connected to the second node (Q'(n)), and a source of the twenty-sixth TFT (T26) is connected to the constant low voltage level.

6. The GOA circuit as claimed in claim 5, wherein the first pull-down module (106) further comprises an eleventh capacitor (C11), wherein a terminal of the eleventh capacitor (C11) is coupled to the constant low voltage level, and the other terminal of the eleventh capacitor (C11) is connected to the gate of the fourteenth TFT (T14); and the second pull-down module (206) further comprises a twenty-first capacitor (C21), wherein a terminal of the twenty-first capacitor (C21) is coupled to the constant low voltage level, and the other terminal of the twenty-first capacitor (C21) is connected to the gate of the twenty-fourth TFT (T24).

7. The GOA circuit as claimed in claim 1, wherein the first pull-down holding module (102) comprises: an eleventh TFT (T11), a twelfth TFT (T12) and a thirteenth TFT (T13), wherein a gate of the eleventh TFT (T11) is coupled to the first scan control signal, and a drain of the eleventh TFT (T11) is coupled to the (m+4)th clock signal (CKm+4); a gate of the twelfth TFT (T12) is coupled to the second scan control signal, and a source of the twelfth TFT (T12) is coupled to the (m+6)th clock signal (CKm+6); a gate of the thirteenth TFT (T13) is connected with a source of the eleventh TFT (T11) and a drain of the twelfth TFT (T12), and a drain of the thirteenth TFT (T13) is coupled to a constant high voltage level, and a source of the thirteenth TFT (T13) is connected to a third node (P(n)); and the second pull-down holding module (202) comprises: a twenty-first TFT (T21), a twenty-second TFT (T22) and a twenty-third TFT (T23), wherein a gate of the twenty-first TFT (T21) is coupled to the first scan control signal, and a drain of the twenty-first TFT (T21) is coupled to m-th clock signal (CKm); a gate of the twenty-second TFT (T22) is coupled to the second scan control signal, and a source of the twenty-second TFT (T22) is coupled to the (m+2)th clock signal (CKm+2); a gate of the twenty-third TFT (T23) is connected with a source of the twenty-first TFT (T21) and a drain of the twenty-second TFT (T22), and a drain of the twenty-third TFT (T23) is coupled to the constant high voltage level, and a source of the twenty-third TFT (T23) is connected to a fourth node (P'(n)).

8. The GOA circuit as claimed in claim 1, wherein the first bootstrap capacitor module (103) comprises a twelfth capacitor (C12) and a thirteenth capacitor (C13), wherein a terminal of the twelfth capacitor (C12) is connected to the first node (Q(n)), and the other terminal of the twelfth capacitor (C12) is connected to the constant low voltage level; a terminal of the thirteenth capacitor (C13) is connected to a third node (P(n)), and the other terminal of the thirteenth capacitor (C13) is connected to the constant low voltage level; and the second bootstrap capacitor module (203) comprises a twenty-second capacitor (C22) and a twenty-third capacitor (C23), wherein a terminal of the twenty-second capacitor (C22) is connected to the second node (Q'(n)), and the other terminal of the twenty-second capacitor (C22) is connected to the constant low voltage level; a terminal the twenty-third capacitor (C23) is connected to a fourth node (P'(n)), and the other terminal of the twenty-third capacitor (C23) is constant low voltage level.

9. The GOA circuit as claimed in claim 8, wherein all of the TFTs are N-channel TFTs.

10. A gate driver on array (GOA) circuit for a liquid crystal display (LCD) panel, the GOA circuit comprising multi-stage GOA circuit repeat units that are cascade connected, and each stage of the GOA circuit repeat units comprising: a first pull-up control module (101), a first pull-down holding module (102), a first pull-down module (106), a first bootstrap capacitor module (103), a first output module (104), a second output module (105), a second pull-up control module (201), a second pull-down holding module (202), a second pull-down module (206), a second bootstrap capacitor module (203), a third output module (204) and a fourth output module (205); wherein:

the first pull-up control module (101), the first pull-down holding module (102), the first pull-down module (106), the first bootstrap capacitor module (103), the first output module (104) and the second output module (105) are all electrically connected to a first node (Q(n)); the second pull-up control module (201), the second pull-down holding module (202), the second pull-down module (206), the second bootstrap capacitor module (203), the third output module (204) and the fourth output module (205) are all electrically connected to a second node (Q'(n)); and m and n are all set to integers, and except a first stage GOA circuit repeat unit, in an n-th stage GOA circuit repeat unit:

the first output module (104), the second output module (105), the third output module (204) and the fourth output module (205) are respectively coupled to an m-th clock signal (CKm), an (m+2)th clock signal (CKm+2), an (m+4)th clock signal (CKm+4) and an (m+6)th clock signal (CKm+6), and sequentially output an n-th scan signal (Gn), an (n+2)th scan signal (Gn+2), an (n+4)th scan signal (Gn+4) and an (n+6)th scan signal (Gn+6) by respectively utilizing the m-th clock signal (CKm), the (m+2)th clock signal (CKm+2), the (m+4)th clock signal (CKm+4) and the (m+6)th clock signal (CKm+6);

the first pull-up control module (101) is coupled to an (n−2)th scan signal (Gn−2) that is outputted by a former (n−1)th stage GOA circuit repeat unit and uses the (n−2)th scan signal to charge the first node (Q(n)), so as to turn on the first output module and the second output module to perform scan signal outputting; the second pull-up control module (201) is coupled to the (n+2)th scan signal (Gn+2) that is outputted by the n-th GOA circuit repeat unit and utilizes the (n+2)th scan signal to charge the second node (Q'(n)), so as to turn on the second output module and the third output module to perform scan signal outputting;

the first pull-down module (106) is coupled to at least the (n+4)th scan signal (Gn+4) that is outputted by the n-th stage GOA circuit repeat unit and a constant low voltage level (VGL) and pulls down a voltage level of the first node under control of the (n+4)th scan signal, so as to turn off the first output module and the second output module; the second pull-down module (206) is coupled to at least an (n+8)th scan signal (Gn+8) that is outputted by a latter (n+1)th stage GOA circuit repeat unit and the constant low voltage level (VGL) and pulls down a voltage level of the second node (Q'(n)) under control of the (n+8)th scan signal, so as to turn off the third output module and the fourth output module;

the first pull-down holding module (102) is coupled to at least a first scan control signal, a second scan control signal, the (m+4)th clock signal (CKm+4), the (m+6)th clock signal (CKm+6) and pulls down voltage levels of the n-th scan signal (Gn) and the (n+2)th scan signal (Gn+2) under control of the first scan control signal, the second scan control signal, the (m+4)th clock signal, the (m+6)th clock signal and the first node; the second pull-down holding module (202) is coupled to at least the first scan control signal, the second scan control signal, the m-th clock signal (CKm) and the (m+2)th clock signal (CKm+2) and pulls down voltage levels of the (n+4)th scan signal (Gn+4) and the (n+6)th scan signal (Gn+6) under control of the first scan control signal, the second scan control signal, the m-th clock signal, the (m+2)th clock signal and the second node; and the first scan control signal and the second scan control signal are phase-inverted, and all of the TFTs are N-channel TFTs.

11. The GOA circuit as claimed in claim 10, wherein, except the first stage GOA circuit repeat unit, in an n-th stage GOA circuit repeat unit:

the first pull-up control module (101) comprises: a tenth TFT (T10) and a tenth capacitor (C10), wherein a gate of the tenth TFT is coupled to an (n−2)th scan signal (Gn−2) that is outputted by the former (n−1)th stage GOA circuit repeat unit, and a source of the tenth TFT is coupled to the first scan control signal, and a drain of tenth TFT is electrically connected to the first node (Q(n)); a terminal of the tenth capacitor (C10) is coupled to the gate of the tenth TFT (T10), and the other terminal of the tenth capacitor (C10) is connected to the constant low voltage level; and the second pull-up control module (201) comprises: a twentieth TFT (T20) and a twentieth capacitor (C20), wherein a gate of the twentieth TFT (T20) is coupled to the (n+2)th scan signal (Gn+2) that is outputted by the n-th stage GOA circuit repeat unit, and a source of the twentieth TFT (T20) is coupled to the first scan control signal, and a drain of the twentieth TFT (T20) is electrically coupled to the second node (Q'(n)); a terminal of the twentieth capacitor (C20) is coupled to the gate of the twentieth TFT (T20), and the other terminal of the twentieth capacitor (C20) is connected to the constant low voltage level.

12. The GOA circuit as claimed in claim 11, wherein in the first stage GOA circuit repeat unit, the gate of the tenth TFT (T10) is coupled to a circuit start signal (STV).

13. The GOA circuit as claimed in claim 12, wherein the first output module (104) comprises: a thirtieth TFT (T30), a thirty-first TFT (T31) and a thirty-second TFT (T32), wherein a source of the thirtieth TFT (T30) is electrically connected to the first node Q(n), and a gate of the thirtieth TFT (T30) is connected to a constant high voltage level; a gate of the thirty-first TFT (T31) is connected to a drain of the thirtieth TFT, and a drain of the thirty-first TFT (T31) is coupled to the m-th clock signal (CKm); a gate of the thirty-second TFT (T32) is connected to a third node (P(n)), and a source of the thirty-second TFT (T32) is connected to the constant low voltage level, and a drain of the thirty-second TFT (T32) is connected with a source of the thirty-first TFT (T31) and is electrically connected to the n-th scan signal (Gn) that is outputted by the n-th stage GOA circuit repeat unit;

the second output module (105) comprises: a thirty-third TFT (T33), a thirty-fourth TFT (T34) and a thirty-fifth TFT (T35), wherein a source of the thirty-third TFT (T33) is electrically connected to the first node (Q(n)), and a gate of the thirty-third TFT (T33) is connected to the constant high voltage level; a gate of the thirty-fourth TFT (T34) is connected to a drain of the thirty-third TFT, and a drain of the thirty-fourth TFT (T34) is coupled to the (m+2)th clock signal (CKm+2); a gate of the thirty-fifth TFT (T35) is connected to a fourth node (P'(n)), and a source of the thirty-fifth TFT (T35) is connected to the constant low voltage level, and a drain of the thirty-fifth TFT (T35) is connected with a source of the thirty-fourth TFT (T34) and is electrically connected to the (n+2)th scan signal (Gn+2) that is outputted by the n-th stage GOA circuit repeat unit;

the third output module (204) comprises: a fortieth TFT (T40), a forty-first TFT (T41) and a forty-second TFT (T42), wherein a source of the fortieth TFT (T40) is electrically connected to the second node (Q'(n)), and a gate of the fortieth TFT (T40) is connected to the constant high voltage level; a gate of the forty-first TFT (T41) is connected to a drain of the fortieth TFT, and a drain of the forty-first TFT (T41) is coupled to the (m+4)th clock signal (CKm+4); a gate of the forty-second TFT (T42) is connected to the fourth node (P'(n)), and a source of the forty-second TFT (T42) is connected to the constant low voltage level, and a drain of the forty-second TFT (T42) is connected with a source of the forty-first TFT (T41) and is electrically connected to the (n+4)th scan signal (Gn+4) that is outputted by the n-th GOA circuit repeat unit; and the fourth output module (205) comprises: a forty-third TFT (T43), a forty-fourth TFT (T44) and a forty-fifth TFT (T45), wherein a source of the forty-third TFT (T43) is electrically connected to the second node (Q'(n)), and a gate of the forty-third TFT (T43) is connected to the constant high voltage level; a gate of the forty-fourth TFT (T44) is connected to a drain of the forty-third TFT, and a drain of the forty-fourth TFT (T44) is coupled to the (m+6)th clock signal (CKm+6); a gate of the forty-fifth TFT (T45) is connected to the fourth node (P'(n)), and a source of the forty-fifth TFT (T45) is connected to the constant low voltage level, and a drain of the forty-fifth TFT (T45) is connected with a source of the forty-fourth TFT (T44) and is electrically connected to the (n+6)th scan signal (Gn+6) that is outputted by the n-th stage GOA circuit repeat unit.

14. The GOA circuit as claimed in claim 13, wherein the first pull-down module (106) comprises: a fourteenth TFT (T14), a fifteenth TFT (T15) and a sixteenth TFT (T16), wherein a gate of the fourteenth TFT (T14) is coupled to the (n+4)th scan signal (Gn+4) that is outputted by the n-th stage GOA circuit repeat unit, and a drain of the fourteenth TFT (T14) is coupled to the second scan control signal, and a source of the fourteenth TFT (T14) is electrically connected to the first node (Q(n)); a gate of the fifteenth TFT (T15) is electrically connected to the first node (Q(n)), and a drain of the fifteenth TFT (T15) is connected to the constant low voltage level, and a source of the fifteenth TFT (T15) is connected to the third node (P(n)); a gate of the sixteenth TFT (T16) is connected to the third node (P(n)), and a drain of the sixteenth TFT (T16) is connected to the first node (Q(n)), and a source of the sixteenth TFT (T16) is connected to the constant low voltage level; and the second pull-down module (206) comprises: a twenty-fourth TFT (T24), a twenty-fifth TFT (T25) and a twenty-sixth TFT (T26), wherein a gate of the twenty-fourth TFT (T24) is coupled to the (n+8)th scan signal (Gn+8) that is outputted by the latter (n+1)th stage GOA circuit repeat unit, and a drain of the twenty-fourth TFT (T24) is coupled to the second scan control signal, and a source of the twenty-fourth TFT (T24) is electrically coupled to the second node (Q'(n)); a gate of the twenty-fifth TFT (T25) is electrically coupled to the second node (Q'(n)), and a drain of the twenty-fifth TFT (T25) is connected to the constant low voltage level, and a source of the twenty-fifth TFT (T25) is connected to the fourth node (P'(n)); a gate of the twenty-sixth TFT (T26) is connected to the fourth node (P'(n)), and a drain of the twenty-sixth TFT (T26) is connected to the second node (Q'(n)), and a source of the twenty-sixth TFT (T26) is connected to the constant low voltage level.

15. The GOA circuit as claimed in claim 14, wherein the first pull-down module (106) further comprises an eleventh capacitor (C11), wherein a terminal of the eleventh capacitor (C11) is coupled to the constant low voltage level, and the other terminal of the eleventh capacitor (C11) is connected to the gate of the fourteenth TFT (T14);

the second pull-down module (206) further comprises a twenty-first capacitor (C21), wherein a terminal of the twenty-first capacitor (C21) is coupled to the constant low voltage level, and the other terminal of the twenty-first capacitor (C21) is connected to the gate of the twenty-fourth TFT (T24).

16. The GOA circuit as claimed in claim 15, wherein the first pull-down holding module (102) comprises: an eleventh TFT (T11), a twelfth TFT (T12) and a thirteenth TFT (T13), wherein a gate of the eleventh TFT (T11) is coupled to the first scan control signal, and a drain of the eleventh TFT (T11) is coupled to the (m+4)th dock signal (CKm+4); a gate of the twelfth TFT (T12) is coupled to the second scan control signal, and a source of the twelfth TFT (T12) is coupled to the (m+6)th clock signal (CKm+6); a gate of the thirteenth TFT (T13) is connect with a source of the eleventh TFT (T11) and a drain of the twelfth TFT (T12), and a drain of the thirteenth TFT (T13) is coupled to the constant high voltage level, and a source of the thirteenth TFT (T13) is connected to the third node (P(n)); and the second pull-down holding module (202) comprises: a twenty-first TFT (T21), a twenty-second TFT (T22) and a twenty-third TFT (T23), wherein a gate of the twenty-first TFT (T21) is coupled to the first scan control signal, and a drain of the twenty-first TFT (T21) is coupled to m-th clock signal (CKm); a gate of the twenty-second TFT (T22) is coupled to the second scan control signal, and a source of the twenty-second TFT (T22) is coupled to the (m+2)th clock signal (CKm+2); a gate of the twenty-third TFT (T23) is connected with a source of the twenty-first TFT (T21) and a drain of the twenty-second TFT (T22), and a drain of the twenty-third TFT (T23) is coupled to the constant high voltage level, and a source of the twenty-third TFT (T23) is connected to the fourth node (P'(n)).

17. The GOA circuit as claimed in claim 16, wherein the first bootstrap capacitor module (103) comprises a twelfth capacitor (C12) and a thirteenth capacitor (C13), wherein a terminal of the twelfth capacitor (C12) is connected to the first node (Q(n)), and the other terminal of the twelfth capacitor (C12) is connected to the constant low voltage level; a terminal of the thirteenth capacitor (C13) is connected to the third node (P(n)), and the other terminal of the thirteenth capacitor (C13) is connected to the constant low voltage level; and the second bootstrap capacitor module (203) comprises a twenty-second capacitor (C22) and a twenty-third capacitor (C23), wherein a terminal of the twenty-second capacitor (C22) is connected to the second node (Q'(n)), and the other terminal of the twenty-second capacitor (C22) is connected to the constant low voltage level; the twenty-third capacitor (C23) is connected to the fourth node (P'(n)), and the other terminal of the twenty-third capacitor (C23) is constant low voltage level.

* * * * *